United States Patent
Shakuda

(10) Patent No.: US 7,973,321 B2
(45) Date of Patent: Jul. 5, 2011

(54) NITRIDE SEMICONDUCTOR LIGHT EMITTING DEVICE HAVING RIDGE PARTS

(75) Inventor: Yukio Shakuda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 190 days.

(21) Appl. No.: 12/289,848

(22) Filed: Nov. 5, 2008

(65) Prior Publication Data
US 2009/0127539 A1    May 21, 2009

(30) Foreign Application Priority Data

Nov. 5, 2007   (JP) ................................ 2007-287630
Nov. 13, 2007  (JP) ................................ 2007-294690

(51) Int. Cl.
*H01L 27/15* (2006.01)
(52) U.S. Cl. ............ 257/79; 257/E27.104; 257/E29.164
(58) Field of Classification Search ............ 257/79, 257/82, 94, 103, 190, E27.104, E29.164
See application file for complete search history.

(56) References Cited

U.S. PATENT DOCUMENTS
2004/0266043 A1 *  12/2004  Oohata et al. ............... 438/46

FOREIGN PATENT DOCUMENTS
JP    2006-310893    11/2006
JP    2007-005473    1/2007

\* cited by examiner

*Primary Examiner* — Thomas L Dickey
(74) *Attorney, Agent, or Firm* — Rabin & Berdo, P.C.

(57) ABSTRACT

As an example of a nitride semiconductor light emitting device, on a sapphire substrate, a GaN buffer layer, an n-type GaN contact layer, an MQW active layer, and a p-type GaN contact layer are sequentially stacked, and a partial region from the p-type GaN contact layer to the middle of the n-type GaN contact layer is mesa-etched so as to form an n electrode. Meanwhile, a p electrode is provided on the p-type GaN contact layer, and, in addition to the p electrode, multiple ridge parts are formed by crystal growth so as to be scattered. By providing the multiple ridge parts, device characteristics can be improved without causing damage on the GaN-based semiconductor layer.

11 Claims, 12 Drawing Sheets

NITRIDE SEMICONDUCTOR LIGHT EMITTING DEVICE HAVING RIDGE PARTS

CROSS REFERENCE TO RELATED APPLICATIONS AND INCORPORATION BY REFERENCE

This application is based upon and claims the benefit of prior Japanese Patent Application P2007-287630 filed on Nov. 5, 2007 and P2007-294690 filed on Nov. 13, 2007; the entire contents of which are incorporated by reference herein.

BACKGROUND OF THE INVENTION

1. Field of the Invention

The present invention relates to a nitride semiconductor light emitting device having improved device characteristics.

2. Description of the Related Art

For example, a nitride semiconductor is used in a blue LED employed as a light source for illumination, backlight, or the like and in LED, LD, and the like used for multi-colorization. Due to the difficulty of manufacturing a bulk single crystal, growth of GaN on a heterogeneous substrate, such as sapphire and SiC, by using a Metal Organic Chemical Vapor Deposition (MOCVD) method is carried out. Being excellent in terms of stability in a high-temperature ammonia atmosphere in an epitaxial growth process, a sapphire substrate is especially used as a growth substrate. A sapphire substrate is an insulating substrate, and a nitride semiconductor on a sapphire substrate is etched after epitaxial growth until an n-type gallium nitride layer is exposed, an n-type contact is formed on the etched surface, and two electrodes, which are a p-type electrode and an n-type electrode, are formed on the same surface side.

On the other hand, a nitride semiconductor light emitting device having a structure in which two electrodes, which are a p-type electrode and an n-type electrode, are arranged opposite to each other has been proposed. For example, as illustrated in FIG. 12, a p-type GaN layer 22, an InGaN active layer 23, an n-type GaN layer 24 are stacked on a p electrode 21. Here, an n electrode is formed on a center portion of the n-type GaN layer 24 so as to achieve a structure in which the n electrode is arranged opposite to the p electrode 21; however, the n electrode is not illustrated. Furthermore, the upper direction of the drawing is a direction of light extraction.

Light generated in the InGaN active layer 23 is emitted in 360 degree direction. In order to increase an amount of light to be extracted to the outside as much as possible, the lower surface of the p electrode 21 formed of metal is used as a reflecting mirror, and light emitted to the lower side is reflected by the p electrode 21 so as to be extracted to the upper side.

However, even if a reflecting mirror is used as described above, due to total reflection occurring at an interface between the n-type GaN layer 24 and an atmospheric layer, the light extraction efficiency is extremely low. Total reflection occurs at a boundary surface in the case where light goes from a medium having a large refractive index towards a medium having a small refractive index, and occurs when an incident angle of light entering the boundary surface is a critical angle or larger.

A range of light entering a boundary surface at an angle smaller than a critical angle below which no total reflection occurs is indicated by a light extraction cone 25. Light, such as reflected light from the p electrode 21 and light directly going upwardly from the InGaN active layer 23, which comes into the range of the light extraction cone 25 proceeds as shown by an arrow of a solid line T into the atmosphere, and then is extracted. However, light which does not come into the range of the light extraction cone 25 causes total reflection, as shown by a solid line R, at an interface between the n-type GaN layer 24 and the atmospheric layer, and becomes light which cannot be extracted.

Especially, the refractive index of GaN (approximately 2.5) is extremely large compared to the refractive index of air (approximately 1.0). Accordingly, when a difference in refractive index is increased, the range of the light extraction cone 25 is decreased; therefore, the light extraction efficiency is deteriorated.

In the above-described conventional structure of nitride semiconductor light emitting device, the light extraction efficiency can not be improved. Therefore, as described in Japanese Patent Publication Application No. 2006-310893, for example, in order to improve the light extraction efficiency, a technique to form asperities in a part of a semiconductor layer is proposed.

This is, as shown by a broken line in FIG. 12, to form a cone-shaped projection 26 on the surface of the n-type GaN layer 24 serving as a light extraction surface by etching processing or blast processing. With the cone-shaped projection 26, for example, light, indicated by the solid line R, which is used to be totally reflected at a boundary surface proceeds inside of the cone-shaped projection 26, and its incident angle into the side surface of the cone-shaped projection 26 becomes smaller than the critical angle. Accordingly, the light is emitted into the atmosphere as shown by a broken line S, and the light extraction efficiency is improved.

However, in order to form the cone-shaped projection 26, etching processing or blast processing is applied on the surface of the n-type GaN layer 24. Accordingly, due to the processing, there is a problem that the n-type GaN layer 24 is damaged and the voltage-current characteristics are affected.

Furthermore, as shown in FIG. 12, in the case where light is extracted not from the n-type GaN layer side but from the p side, it is necessary to perform etching processing or blast processing on a p-type GaN-based semiconductor layer, such as a p-type GaN layer, so as to form a cone-shaped projection. Processing damage on a p-type GaN-based semiconductor layer is larger than that on an n-type GaN-based semiconductor layer. Since processing damage causes defect which exhibits n-type conduction, device leakage current is increased, or an ohmic junction between an electrode and a p-type GaN-based semiconductor layer is made difficult because of GaN becoming highly resistive.

In the meantime, as another example of a nitride semiconductor light emitting device, a ridge waveguide-type nitride semiconductor laser having a ridge stripe structure is known. In order to mount and electrically connect the semiconductor laser device onto a substrate, a flip-chip bonding method is employed. Flip-chip bonding is, as described in Japanese Patent Publication Application No. 2007-5473, for example, to bond an electrode on a ridge part and an electrode on a submount by soldering or the like by placing a surface on the side of the ridge part formed on a p-type nitride semiconductor down.

A ridge waveguide-type nitride semiconductor laser device is configured, for example, as shown by a solid line part in FIG. 22. An n-type nitride semiconductor layer 82, an active layer 83, a p-type GaN-based semiconductor layer 84 are sequentially stacked on a conductive substrate 81, and a convex-shaped ridge stripe part B is formed on the p-type GaN-based semiconductor layer 84. A p electrode 85 is formed at a top of the ridge stripe part B, while an n electrode 87 is formed on a rear surface of the conductive substrate 81. The p electrode 85 is flip-chip bonded with an electrode, a wiring pattern, or the like on a supporting substrate 86.

In a semiconductor laser device having such a configuration, a stripe width of the ridge stripe part B is formed to be narrow for narrow injection of electric current; therefore, the ridge stripe part B is susceptible to damage. For example, in a process to scribe or divide a wafer, if a surface in which the ridge stripe part B is formed is caused to come into contact with a stage or the like or is applied with pressure, the ridge stripe part B may be damaged.

Furthermore, when the flip-chip bonding is carried out, a certain pressure from the n electrode 87 side is applied so as to establish a bond with the supporting substrate 86. Therefore, stress is concentrated in the ridge stripe part B, and damage occurs.

As described above, when the ridge stripe part B is damaged, due to a decrease in light emitting properties and light emission intensity, and the like, reliability of the laser device is deteriorated as a result. Furthermore, the nitride semiconductor laser is likely to incline to the supporting substrate 86 when bonded thereto; therefore, this becomes a cause for lowering the device characteristics.

Furthermore, an inclination direction of and an inclination angle of a nitride semiconductor laser when a bond with the supporting substrate 86 is established are different for each nitride semiconductor laser device. Accordingly, due to the inconsistency in inclination, heat-releasing properties vary; therefore, this also becomes a cause for creating a variation in the light emitting properties.

Therefore, as shown by a dotted line in FIG. 22, it is also conceivable to form ridge parts 90 and 91, which have a ridge stripe structure similar to that of the ridge stripe part B, with metal or an insulating film. It is assumed that, in this method, compared to the case where metal is embedded in all grooves on both sides of the ridge stripe part B, transverse stress due to a difference in heat expansion coefficient can be reduced to some degree. However, the fact remains that stress applied onto the ridge stripe part B due to the difference in heat expansion coefficient occurs in both a longitudinal direction and a transverse direction. Therefore, damage on the ridge stripe part B and a decrease in the light-emitting properties are caused.

SUMMARY OF THE INVENTION

The present invention has been made in order to solve the above-described problems, and an object of the present invention is to provide a nitride semiconductor light emitting device in which device characteristics can be improved without damaging a stacked GaN-based semiconductor layer.

In order to achieve the above-described object, an invention according to claim 1 is a nitride semiconductor light emitting device, which includes at least: an n-type GaN-based semiconductor layer; an active layer; and a p-type GaN-based semiconductor layer, and in which asperities are formed on one surface of any one of the n-type GaN-based semiconductor layer and the p-type GaN-based semiconductor layer by causing crystal growth of multiple ridge parts formed of a GaN-based semiconductor.

Furthermore, an invention according to claim 2 is the nitride semiconductor light emitting device according to claim 1, in which the crystal growth of the ridge parts is carried out by selective growth.

Furthermore, an invention according to claim 3 is the nitride semiconductor light emitting device according to claim 2, in which the shape of each ridge part is six-sided pyramid or three-sided pyramid, and one side of each ridge part is formed in parallel with an M-plane Furthermore, an invention according to claim 4 is the nitride semiconductor light emitting device according to any one of claim 1 to claim 3, in which the ridge parts are formed on a light extraction surface of the p-type GaN-based semiconductor layer and are formed of a p-type GaN layer.

Furthermore, an invention according to claim 5 is the nitride semiconductor light emitting device according to any one of claim 1 to claim 3, in which the ridge parts are formed on a light extraction surface of the p-type GaN-based semiconductor layer and are formed of an n-type GaN layer having a carrier concentration of $10^{19}$ cm$^{-3}$ or higher.

Furthermore, an invention according to claim 6 is the nitride semiconductor light emitting device according to any one of claim 1 to claim 3, in which the ridge parts are formed on a light extraction surface of the p-type GaN-based semiconductor layer and have a InGaN/GaN quantum well structure, and an In composition ratio of the InGaN is higher than an In composition ratio of a well layer of the active layer.

Furthermore, an invention according to claim 7 is the nitride semiconductor light emitting device according to claim 6, in which the InGaN/GaN quantum well structure is doped with an n-type impurity.

According to the present invention, asperities are formed by causing crystal growth of multiple ridge parts composed of a GaN-based semiconductor layer on a surface of any one of an n-type GaN-based semiconductor layer and a p-type GaN-based semiconductor layer. Accordingly, without damaging the p-type GaN-based semiconductor layer and the n-type GaN-type semiconductor layer, the light extraction efficiency can be improved.

Furthermore, in the case where the ridge part made of a GaN-based semiconductor layer is used as a supporting column, the supporting column and a p-type GaN-based semiconductor layer in which the ridge part to serve as a light emitting region is formed contain GaN as a common constituent material. Accordingly, a different in heat expansion coefficient is eliminated, occurrence of stress due to the difference is prevented, and no adverse effect on the ridge part is caused.

In the meantime, during a device manufacturing process and while establishing a bond to a supporting substrate, the supporting column formed by a GaN-based semiconductor acts as a protective barrier so that pressure and stress are not applied to the ridge part. Therefore, an adverse effect on the ridge part to serve as a light emitting region can be prevented.

DETAILED DESCRIPTION OF THE INVENTION

Figure 1:
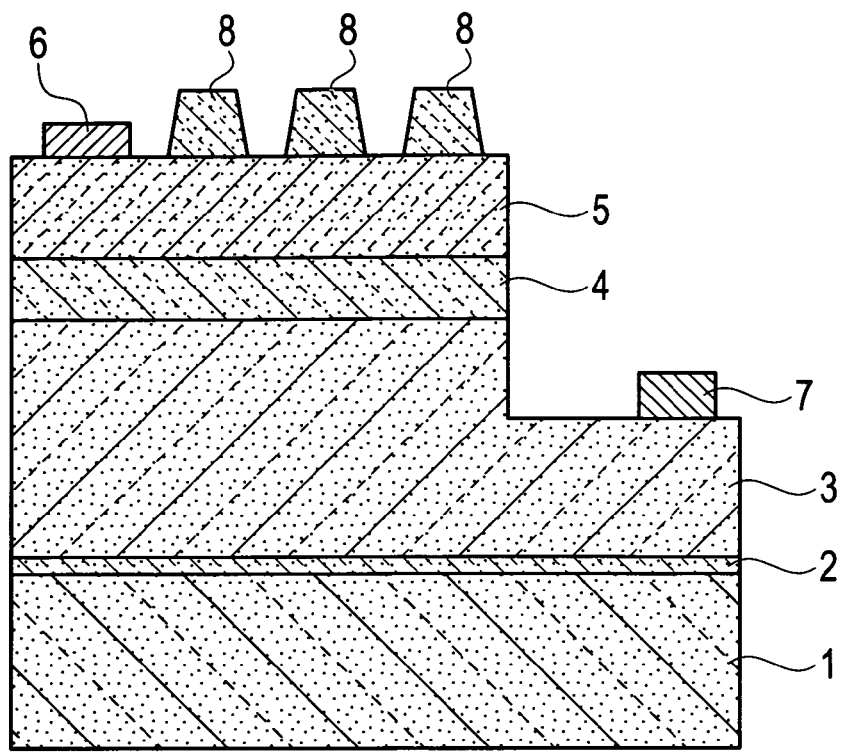
FIG. 1 is a view illustrating an example of a cross-sectional structure of a nitride semiconductor light emitting device of the present invention.
Figure 2:
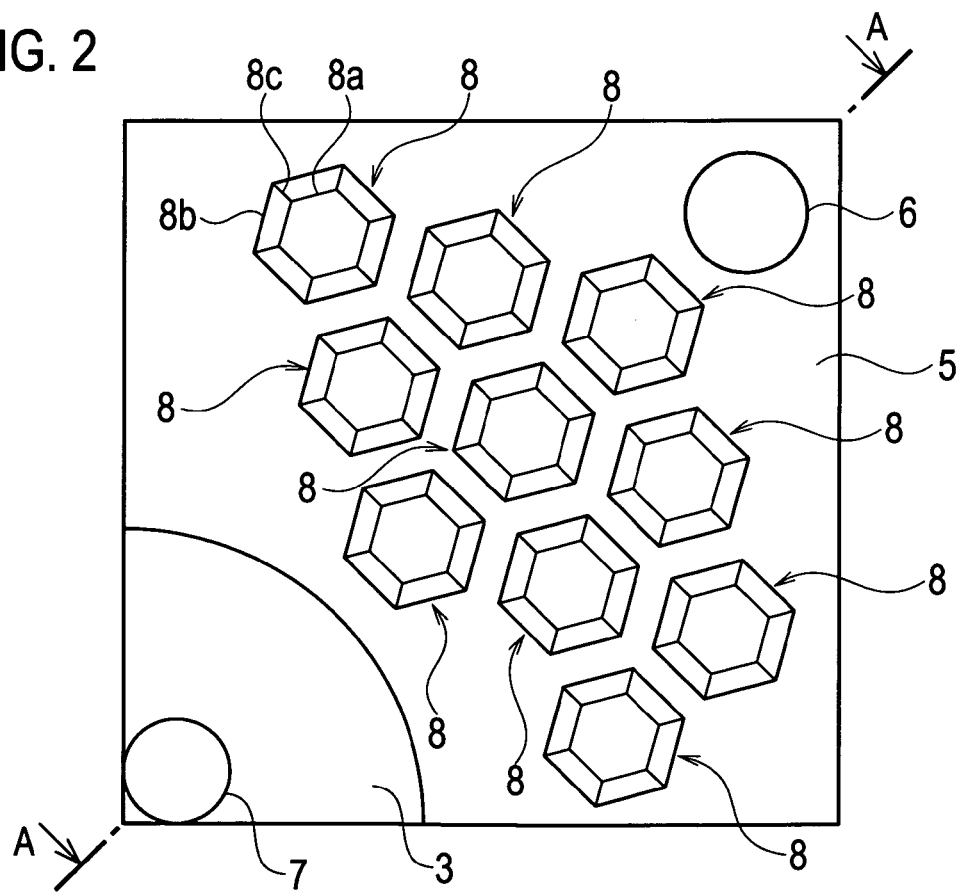
FIG. 2 is a plan view of the nitride semiconductor light emitting device in FIG. 1 when viewed from above.

Hereinafter, an embodiment of the present invention will be described with reference to drawings. FIG. 1 illustrates an example of a cross-sectional structure of LED as an example of a nitride semiconductor light emitting device of the present invention. Meanwhile, FIG. 2 illustrates a plan view of the nitride semiconductor light emitting device in FIG. 1 when viewed from above, and an A-A cross section of FIG. 2 is illustrated in FIG. 1.

A nitride semiconductor constituting a nitride semiconductor light emitting device represents a quaternary mixed crystal of AlGaInN, is a so-called III-V group nitride semiconductor, and can be expressed as $Al_xGa_yIn_zN$ ($X+Y+Z=1$, $0 \leq x \leq 1$, $0 \leq y \leq 1$, $0 \leq z \leq 1$). In the meantime, a GaN-based semiconductor is a semiconductor composed only of GaN or a semiconductor including GaN in the constituent materials, and can be expressed as $0 < y \leq 1$ in the above-described quaternary mixed crystal of AlGaInN.

In the example in FIG. 1, on a sapphire substrate 1, a GaN buffer layer 2, an n-type GaN contact layer 3, an MQW active layer 4, and a p-type GaN contact layer 5 are sequentially stacked. A partial region from the p-type GaN contact layer 5 to the middle of the n-type GaN contact layer 3 is mesa-etched, and an n electrode 7 is formed on a surface having the n-type GaN contact layer 3 exposed. On the other hand, on the p-type GaN contact layer 5, a p electrode 6 is provided. Furthermore, on the p-type GaN contact layer 5, multiple ridge parts 8 are formed so as to be scattered.

The MQW active layer 4 is an active layer having a multi quantum well structure, and is formed by multiplexing the quantum well structure in which a well layer is sandwiched by barrier layers each having a larger band gap than that of the well layer. The quantum well structure may be single without being multiplexed, and, in such a case, a single quantum well (SQW) structure is formed.

Figure 3:
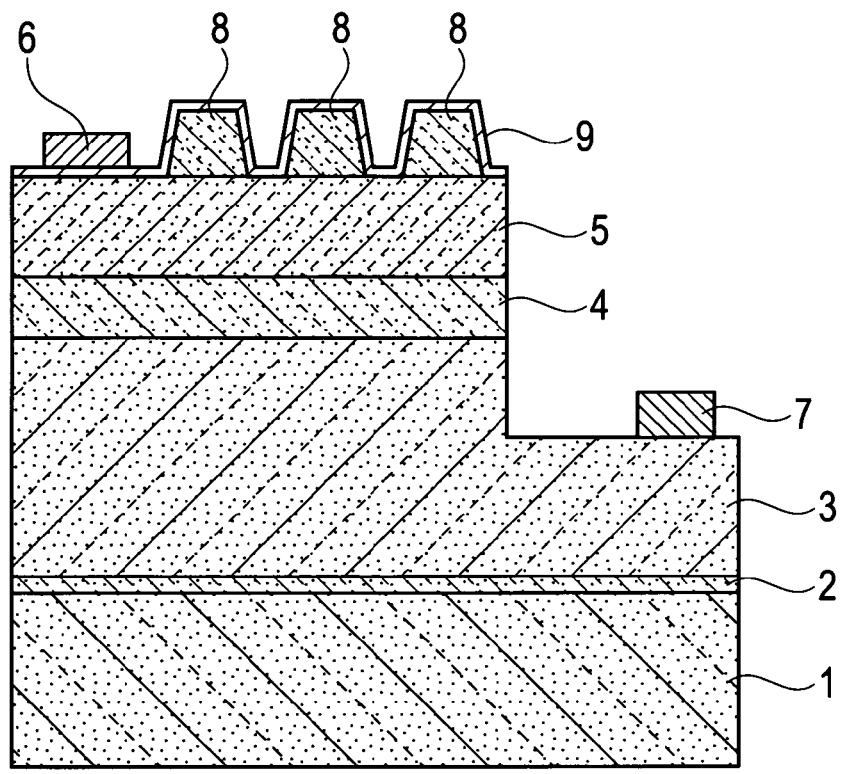
FIG. 3 is a view illustrating another example of a cross-sectional structure of a nitride semiconductor light emitting device of the present invention.

Furthermore, in the structure in FIG. 1, the width of an electric current path between the p electrode 6 and the n electrode 7 is narrow. Accordingly, the value of resistance between the p electrode 6 and the n electrode 7 is high, an operating voltage is increased, and the MQW active layer 4 does not emit light uniformly. Therefore, there is a problem that only a region through which electric current goes strongly emits light. Thus, as illustrated in FIG. 3, it may be configured that a transparent electrode 9 is formed all over the surface of the ridge part 8 and the surface of the p-type GaN contact layer 5, and the p electrode 6 for electric current injection is formed on the transparent electrode 9. For the transparent electrode 9, ZnO, ITO, or the like is used. By having such a configuration, the above-described problem is solved, and internal light, such as light emitted from the MQW active layer 4, can be extracted through the transparent electrode 9 to the p side.

The ridge part 8 is formed, for example, in a six-sided pyramid shape having a trapezoidal cross-section shape. The shape viewed from above is, as illustrated in FIG. 2, hexagonal, and is composed of a hexagonal-shaped bottom surface 8b, a hexagonal-shaped top surface 8a, a ridge line 8c, and the like. Furthermore, the ridge part 8 is composed of a GaN-based semiconductor, and is formed by selective growth which will be described later.

Figure 4:
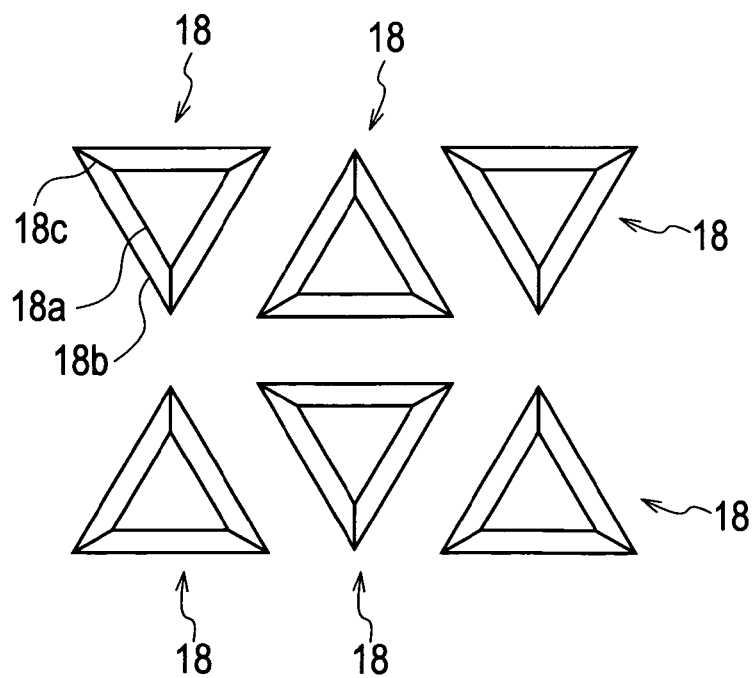
FIG. 4 is a view illustrating a ridge part shape different from that in FIG. 2.

On the other hand, the shape of the ridge part may be constituted by, as illustrated in FIG. 2, not a six-sided pyramid, but a three-sided pyramid having a trapezoidal cross-section shape. FIG. 4 is a view of a part of the multiple ridge parts 18 when viewed from above in the case where the ridge part 8 is formed in a three-sided pyramid shape. In this case, the shape is composed of a triangle-shaped bottom surface 18b, a triangle-shaped top surface 18a, a ridge line 18c, and the like.

By the way, the ridge parts 8 and 18 are formed by selective growth which will be described later. In order to manufacture a separated trapezoidal ridge part, one side of a shape of an opening of a selective growth mask is formed parallel with an M-plane (10-10) of the p-type GaN contact layer 5. Accordingly, all of the sides of the bottom surface 8b of the ridge part 8 are parallel with the M plane. Furthermore, one of the sides of the bottom surface 18b of the ridge part 18 is parallel with the M-plane.

The ridge parts 8 and 18 are composed of a GaN-based semiconductor. Firstly, as a first example, they are composed of a p-type GaN layer. In the case where the ridge part is a p-type GaN layer, the ridge part is p-type GaN which is the same as the p-type GaN contact layer 5 in contact with the ridge part. Accordingly, as shown in FIG. 3, when the transparent electrode 9 made of ZnO, ITO, or the like is manufactured all over the ridge part and the surface of the p-type GaN contact layer 5, it is possible to increase an area of contact between p-type GaN and the transparent electrode 9. Therefore, compared to the case where no ridge part is formed, the operating voltage can be lowered.

Next, a second example of a ridge part is composed of an n-type GaN layer. By doping an n-type impurity, such as Si, at a high concentration, n-type GaN having a carrier concentration of $1 \times 10^{19}$ cm$^3$ or above is manufactured. The n-type GaN doped with an n-type impurity at a high concentration as described above emits green light when receiving light emitted from the MQW active layer 4. Therefore, when an In ratio of the MQW active layer 4 is adjusted so that blue light can be emitted from the MQW active layer 4, in combination with the green light emitted from the ridge part composed of the n-type GaN layer, almost-white light can be obtained even if no fluorescent material is present.

Next, a third example of a ridge part is formed to have a quantum well structure in which an InGaN well layer is sandwiched by GaN barrier layers and an MQW structure in which an InGaN layer and a GaN layer are alternately stacked with each other in several cycles similarly to the MQW active layer 4. In this case, an In composition ratio of the InGaN well layer constituting the ridge part is set to be larger than an In composition ratio of the InGaN well layer of the MQW active layer 4, and the ridge part is formed so as to carry out emission of green light in a range from 500 nm to 530 nm. Then, by adjusting the In composition ratio of the InGaN well layer of the MQW active layer 4, it is configured that light having an emission wavelength in a range, for example, from 400 nm to 450 nm is generated. By having such a configuration, by combining the light from the MQW active layer 4 and light from the ridge part, almost-white light can be obtained even without using a fluorescent material. Furthermore, by doping each of the InGaN well layer and the GaN barrier layer which constitute the ridge part with silicon (Si), the light emission efficiency can be increased.

In a configuration example of the above-described case, the MQW active layer 4 which emits short-wavelength light is formed to have, for example, an In composition ratio of the InGaN well layer in a range from 10% to 15%, and is formed in a stacked structure in which an InGaN well layer having a film thickness in a range from 20 Å to 30 Å and a GaN barrier layer having a film thickness of 150 Å are alternately stacked with each other in approximately 4 to 10 cycles. In the meantime, the ridge part 8 or 18 which emits long-wavelength light is formed to have, for example, an In composition ratio of the InGaN layer of approximately 20%, and is formed in a stacked structure in which an InGaN layer having a film thickness of 30 Å and a GaN layer having a film thickness of 150 Å are alternately stacked with each other in approximately 4 to 30 cycles. Furthermore, in the case where the ridge part 8 or 18 is doped with silicon (Si), the impurity concentration can be in a range from $10^{17}$ to $10^{19}$ cm$^{-3}$.

Figure 5:
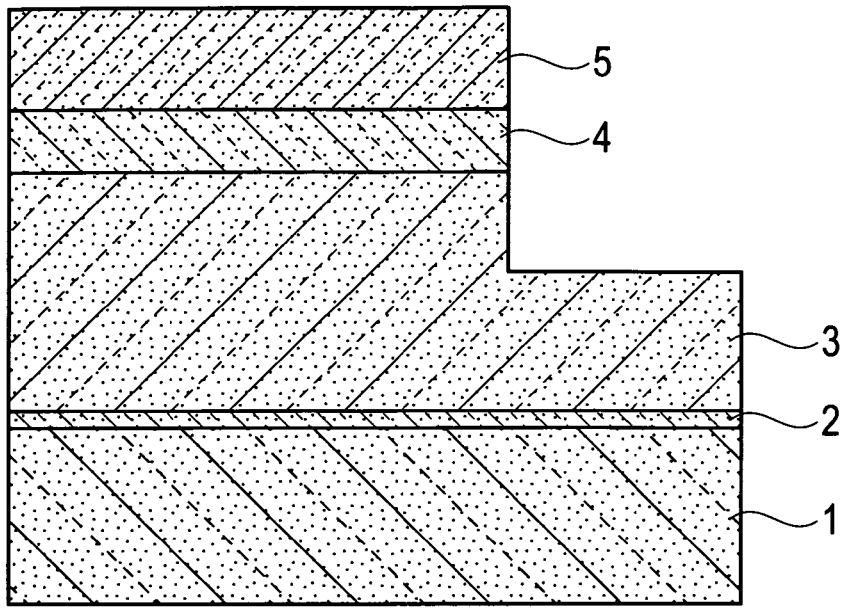
FIG. 5 is a view illustrating a manufacturing process of a nitride semiconductor light emitting device of the present invention.

A manufacturing method of the GaN-based semiconductor light emitting device illustrated in FIG. 1 will be described hereinafter in reference with FIG. 5 to FIG. 7. As a manufacturing method, a metal organic chemical vapor deposition (MOCVD) method is mainly adopted. The sapphire substrate 1 is transferred into an MOCVD device, and the temperature is raised up to approximately 1050° C. while circulating hydrogen gas so as to subject the sapphire substrate 1 to thermal cleaning. Next, on the sapphire substrate 1, for example, the GaN buffer layer 2 is grown at a film thickness of 0.01 μm or smaller at a low temperature in a range from 600 to 700° C. Thereafter, the temperature of the substrate is raised to 1000° C. or above, the impurity Si-doped n-type GaN contact layer 3 is stacked at a film thickness in a range from 3 to 5 μm, the temperature is lowered to approximately 700° C., and the MQW active layer 4 is formed by alternately stacking a well layer, which is InGaN, and a barrier layer, which is GaN, with each other in several cycles at a film thickness of 0.1 μm. Next, the substrate temperature is raised to 1000° C. or above, and the impurity Mg-doped p-type GaN contact layer 5 is stacked at a film thickness in a range from 0.1 to 0.3 μm.

Next, a mask is formed in a predetermined region, in which the ridge part 8 is to be manufactured, on the p-type GaN contact layer 5. A partial region is dry etched starting from the p-type GaN contact layer 5 until the n-type GaN contact layer 3 is exposed. By this dry etching, the GaN-based semiconductor up to 0.6 μm is removed. Thereafter, by removing the mask, the stacked structure body shown in FIG. 5 can be obtained.

Figure 6:
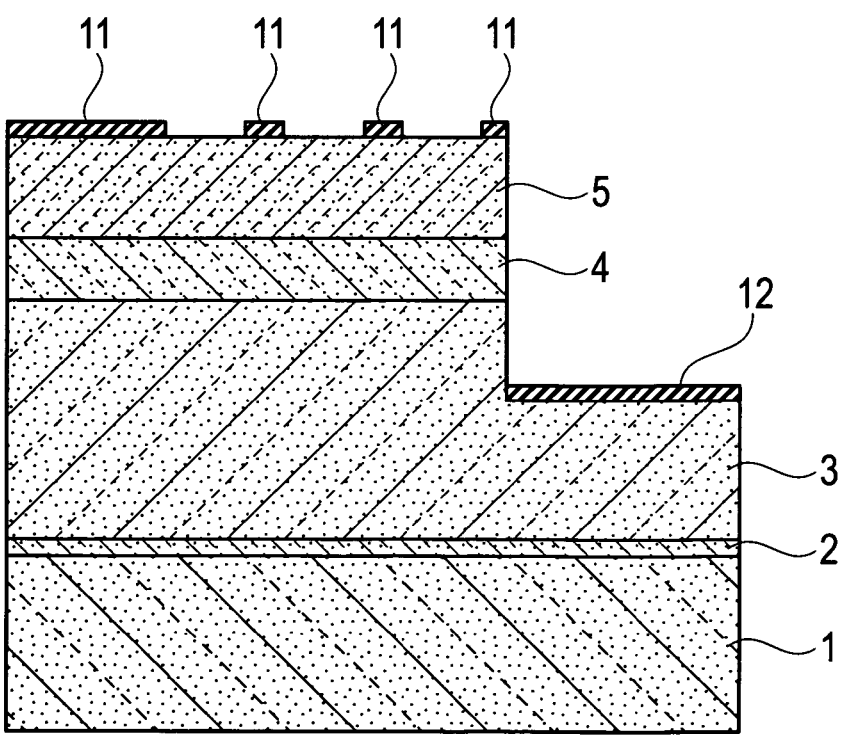
FIG. 6 is a view illustrating the manufacturing process of a nitride semiconductor light emitting device of the present invention.

Next, as illustrated in FIG. 6, a selective growth mask 11 is formed on the p-type GaN contact layer 5. Firstly, a resist which is to serve as the selective growth mask 11 is applied for coating by Spin On Glass (SOG), and then heated at 400° C. for 30 minutes. Thereafter, a part in which the ridge part 8, 18 is to be manufactured is removed so as to form an opening part, and the surface of the p-type GaN contact layer 5 is exposed. The selective growth mask 11 is composed of SiO$_2$ or the like.

Figure 8:
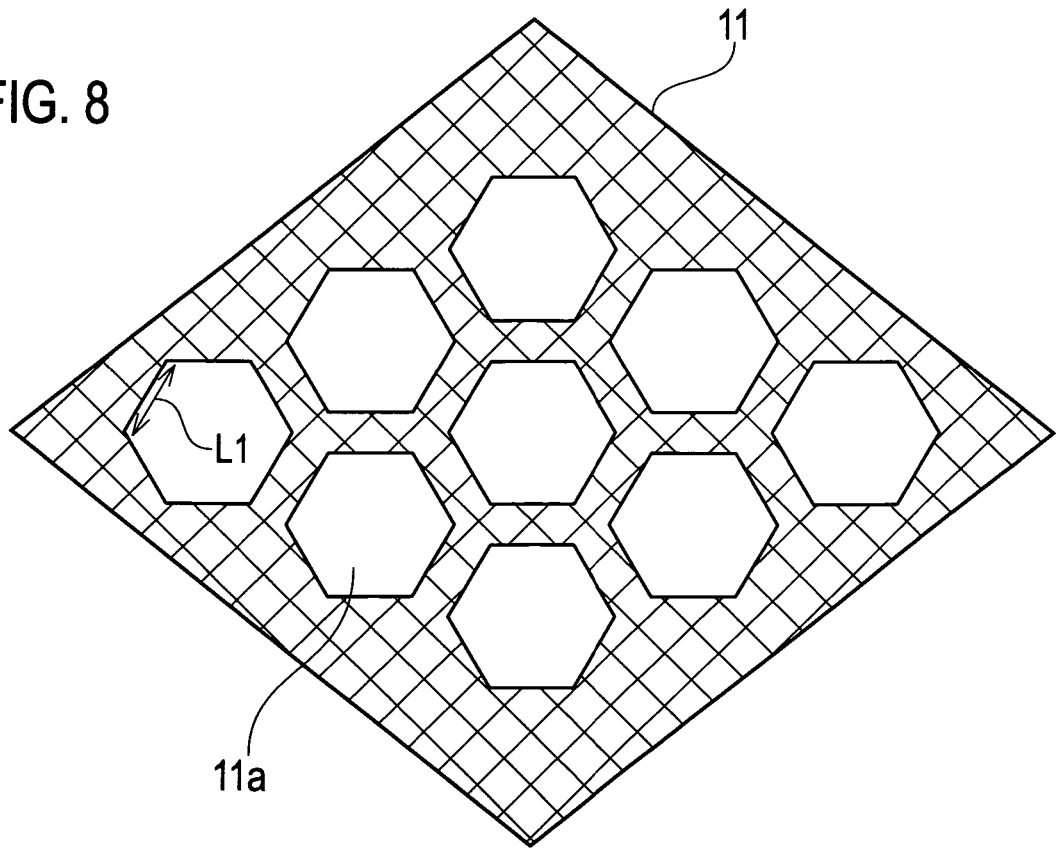
FIG. 8 is a view illustrating an example of a shape of a selective growth mask.
Figure 18:
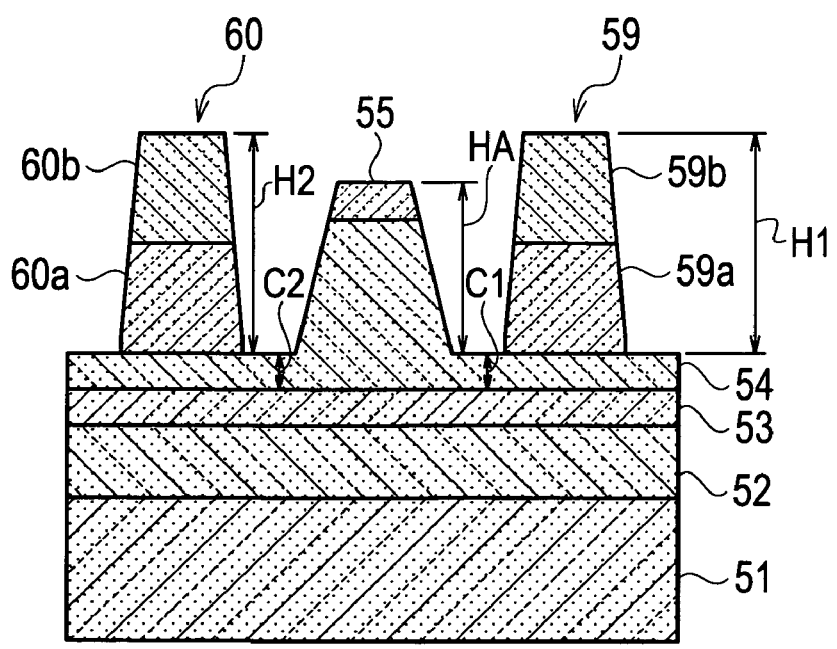
FIG. 18 is a view illustrating the manufacturing process of the nitride semiconductor light emitting device in FIG. 13.

In the formation of the opening part, in the case where the six-sided pyramid-shaped ridge part 8 as illustrated in FIG. 2 is to be manufactured, it is configured that a hexagonal-shaped opening part 11a, as illustrated in FIG. 8, is formed on the selective growth mask 11. On the other hand, in the case where the three-sided pyramid-shaped ridge part 18 as illustrated in FIG. 18 is to be manufactured, it is configured that a triangle-shaped opening part 111a, as shown in FIG. 9, is formed on the selective growth mask 111.

Figure 7:
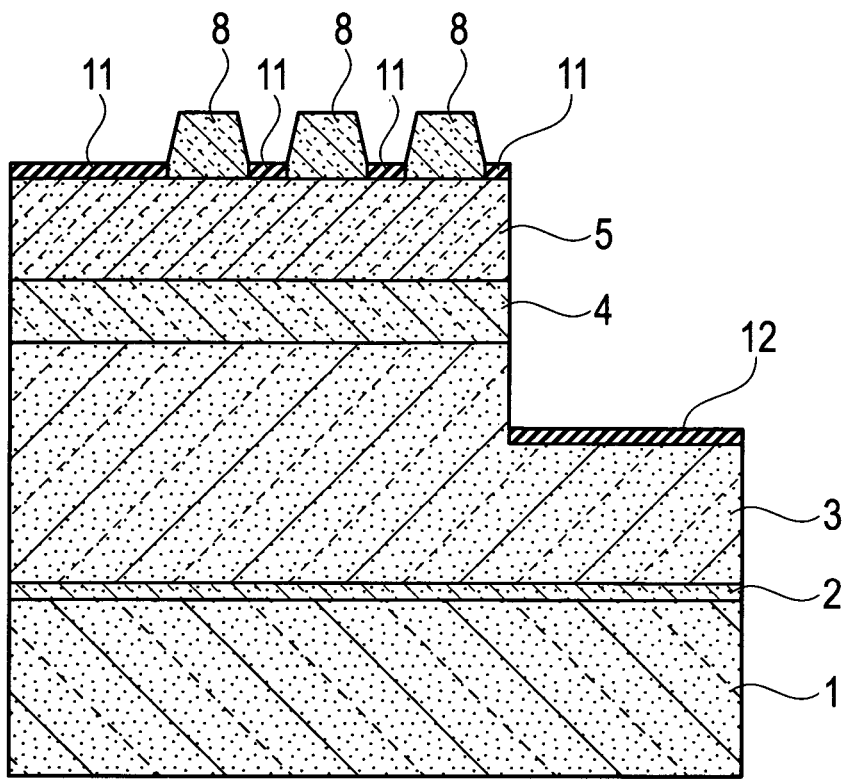
FIG. 7 is a view illustrating the manufacturing process of a nitride semiconductor light emitting device of the present invention.

In the case of using the selective growth mask 11, as illustrated in FIG. 7, the ridge part 8 is manufactured by causing a GaN-based semiconductor to grow in the opening part. By the way, lattice constants are different between a growth substrate, such as a sapphire substrate, and GaN. Accordingly, in a GaN-based semiconductor layer grown on the growth substrate, there is dislocation (lattice defect) in a direction vertically extending from the substrate. As a method to reduce such dislocation, selective epitaxial lateral overgrowth (ELO) is well-known. In the present invention, the above-described selective growth is used.

In this selective growth, by covering the p-type GaN contact layer 5 with the selective growth mask 11 composed of a dielectric body, such as SiO$_2$, re-growth firstly occurs from the center of the opening part 11a of the selective growth mask 11 (selective growth), and then a growth layer also extends to the side of the selective growth mask 11 so that crystal growth is formed in a lateral direction. Here, in order to cause crystal growth such that the cross section of the ridge part being in an isolated state without bonding in a lateral direction is formed into a trapezoidal shape, it is necessary to set one side L1 of each of the opening parts 11a on the selective growth mask 11 to be parallel with an M-plane (10-10) of the p-type GaN contact layer 5.

Figure 9:
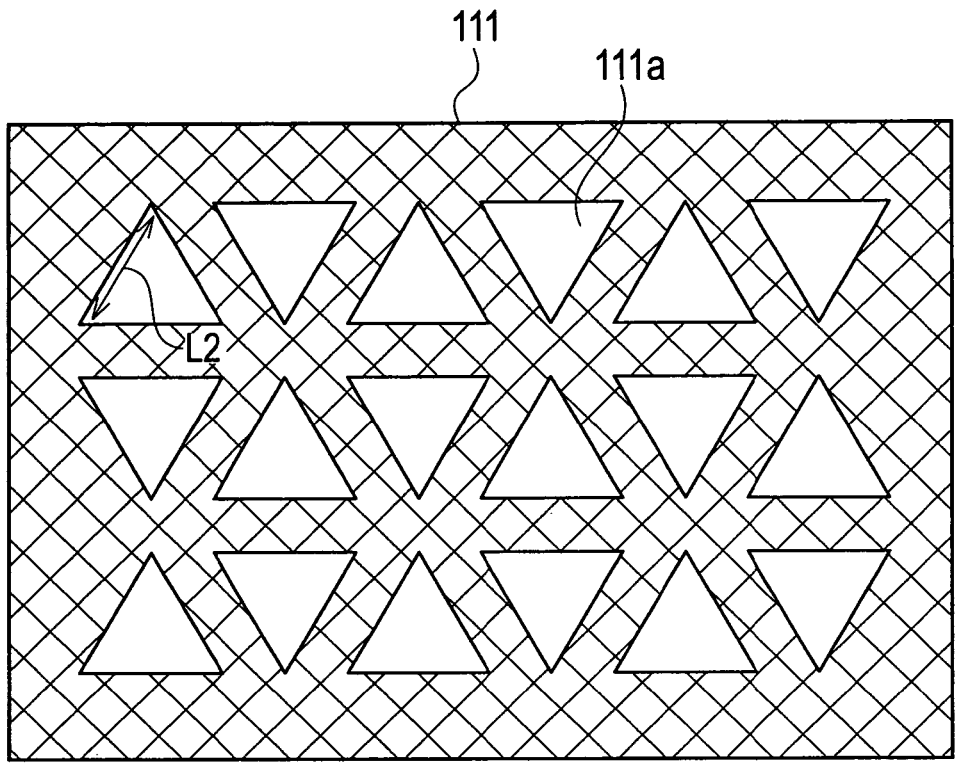
FIG. 9 is a view illustrating an example of a shape of a selective growth mask.

When using the selective growth mask 111 in FIG. 9, it is necessary to set one side L2 of each of the opening parts 111a to be parallel with the M-plane (10-10) of the p-type GaN contact layer 5 because of the following reasons. As is well known, a nitride semiconductor has a hexagonal crystal structure, which is the Wurtzite structure. Accordingly, when the M-plane, which is a cylindrical surface, is set to be parallel with one side of the opening part of the selective growth mask, a growth rate in a vertical direction is larger than a growth rate in a lateral direction; and, therefore, an isolated shape is formed. Furthermore, the selective growth is carried out at a growth temperature of 900° C. or below.

By the way, in the case of forming a film, such as a p-type GaN layer, after the growth of the MQW active layer 4 with InGaN/GaN, in order to enhance crystal quality, epitaxial growth is conventionally performed at a growth temperature around 1000° C., which is 200 to 300° C. higher than the growth temperature of the active layer. Accordingly, since the growth temperature of the p-type layer is high, the active layer 4 which has been already formed is damaged by heat; therefore, emission characteristics are significantly deteriorated.

Especially, in the case where a nitride semiconductor light emitting device having a long light emission wavelength in a range from green to yellow is manufactured, the In composition ratio of the well layer is as high as above 20%. When the In composition ratio is high, in the case where the nitride semiconductor light emitting device is placed in a high-temperature state, In sublimes and become susceptible to decomposition. Accordingly, the light emission efficiency is enormously decreased. When the nitride semiconductor light emitting device keeps receiving heat damage, In is isolated and the wafer may be blackened. Therefore, after the formation of the active layer 4, it is necessary to shorten a time period for crystal growth at a high temperature around 1000° C. as much as possible.

On the other hand, since the ridge part is for enhancing the light extracting efficiency, it is not necessary to place too much importance on the crystal quality. Accordingly, it is possible to avoid heat damage to the active layer 4 as much as possible by adopting a growth temperature of 900° C. or below. Especially, in the case where the ridge part is made in an InGaN/GaN quantum well structure and the In composition ratio is increased in order to achieve longer wavelength light emission than that of the active layer 4, this is effective because there is no process of crystal growth at a high temperature around 1000° C. after the formation of the ridge part.

By the way, in the region in which the n-type GaN contact layer 3 is exposed by mesa etching, the mask 12 is formed. This mask 12 is an insulating film, and may be made of the same material as that of the selective growth mask 11 or made of a different material. The ridge part 8, 18, as described above, is formed by a GaN-based semiconductor, and types thereof include p-type GaN, n-type GaN, an InGaN/GaN multi-quantum well structure, and the like.

When the selective growth is completed, the ridge part 8 is formed as illustrated in FIG. 7. Thereafter, when the p electrode 6 and the n electrode 7 are formed by removing the selective growth mask 11 and the mask 12, the nitride semiconductor light emitting device illustrated in FIG. 1 is completed. Here, each of the p electrode 6 and the n electrode 7 is an Al/Ni metal multi-layer film obtained by forming, from the lower side, Al at a film thickness of 3000 Å and Ni at a film thickness of 300 Å thereon. Here, in the case of providing the transparent electrode 9 as illustrated in FIG. 3, after the selective growth mask 11 and the mask 12 are removed, after, for example, ZnO as the transparent electrode 9 is formed at approximately 2000 Å, the p electrode 6 and the n electrode 7 are formed.

Note that, as for the manufacture of the individual semiconductor layers, it is possible to form a semiconductor layer having a predetermined composition and a predetermined conductivity type at a necessary thickness by sequentially growing at a temperature in an approximate range from 700° C. to 1200° C. while supplying, together with hydrogen or nitrogen which serves as a carrier gas, a reactant gas, such as triethyl gallium (TEGa), trimethyl gallium (TMGa), ammonia ($NH_3$), trimethyl aluminum (TMA), and trimethyl indium (TMIn), which corresponds to a component of the individual semiconductor layers, and a necessary gas, such as silane ($SiH_4$) as a dopant gas for forming an n-type layer and $CP_2Mg$ (cyclopentadienyl magnesium) as a dopant gas for forming a p-type layer.

Figure 10:
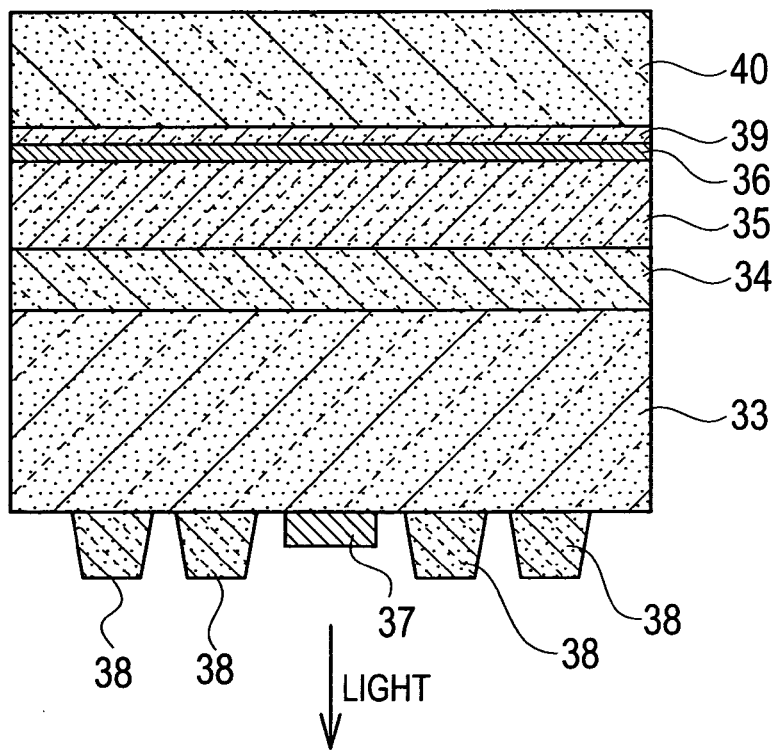
FIG. 10 is a view illustrating another example of a cross-sectional structure of a nitride semiconductor light emitting device of the present invention.

Next, one example of a nitride semiconductor light emitting device configured to extract light from the n electrode side is shown in FIG. 10. This is one in which the light extraction efficiency is increased by forming a ridge part 38 on an n-type GaN contact layer 33 by selective growth. The ridge part 38 is composed of, similarly to the ridge parts 8 and 18, a six-sided pyramid or a three-sided pyramid having a trapezoidal-shaped cross section, and is formed so as to be scattered around an n electrode 37. Furthermore, the ridge part 38 is formed of a GaN-based semiconductor, and, as similarly to the ridge parts 8 and 18, is composed by p-type GaN, n-type GaN, an InGaN/GaN multi-quantum well structure, or the like.

A manufacturing method of the nitride semiconductor light emitting device in FIG. 10 will be briefly described. A sapphire substrate serving as a growth substrate is placed into an MOCVD device, and the temperature is raised up to approximately 1050° C. while circulating hydrogen gas so as to subject the sapphire substrate to thermal cleaning. The temperature is lowered to approximately 600 to 700° C., and a GaN buffer layer which is to serve as a separating layer at a low temperature is grown at a film thickness of 0.01 µm or below.

Thereafter, the temperature of the substrate is raised to 1000° C. or above, the impurity Si-doped n-type GaN contact layer 33 having a film thickness in a range from 3 to 5 µm is stacked thereon, the temperature is lowered to approximately 700° C., and the MQW active layer 34 is formed by alternately stacking InGaN as a well layer and GaN as a barrier layer in several cycles at a film thickness of 0.1 µm. Then, the temperature of the substrate is raised to 1000° C. or above, and the impurity Mg-doped p-type GaN contact layer 35 is stacked at a film thickness of 0.1 to 0.3 µm.

Next, as the p electrode 36, a transparent electrode, such as ZnO electrode, for example, is formed, and, on the p electrode 36, the reflecting film 39 serving as a white-silver reflecting mirror, such as an Al or Ag film, is stacked by a deposition method. Thereafter, the supporting substrate 40 is arranged on the upper side of the reflecting film 39, and the supporting substrate 40 is pasted onto the reflecting film 39 by use of soldering, thermal compression, or the like.

Next, in order to remove the sapphire substrate, Laser Lift Off (hereinafter, abbreviated as LLO) is adopted. For example, by emitting a KrF laser oscillating at 248 nm from the sapphire substrate side towards the GaN buffer layer so as to decompose GaN in the GaN buffer layer, the sapphire substrate is detached.

After the detachment of the sapphire substrate, similarly to the process illustrated in FIG. 6 and FIG. 7, a selective growth mask is formed by SOG, an opening part is formed, and the ridge part 38 is re-grown by selective growth. As for the selective growth mask, the selective growth mask 11 or 111 illustrated in FIGS. 8 and 9, respectively, is used. Meanwhile, the opening part is formed so that one side L1, L2 of the opening part 11a, 111a of the selective growth mask 11, 111, respectively, is parallel with the M-plane. As described above, after the ridge part 38 is crystal grown, by removing the selective growth mask and forming the n electrode 37, the nitride semiconductor light emitting device in FIG. 10 is completed. Here, the n electrode 37 is formed by a metal multi-layer film in which Al/Ni is stacked at a film thickness of 3000 Å/300 Å.

Figure 11:
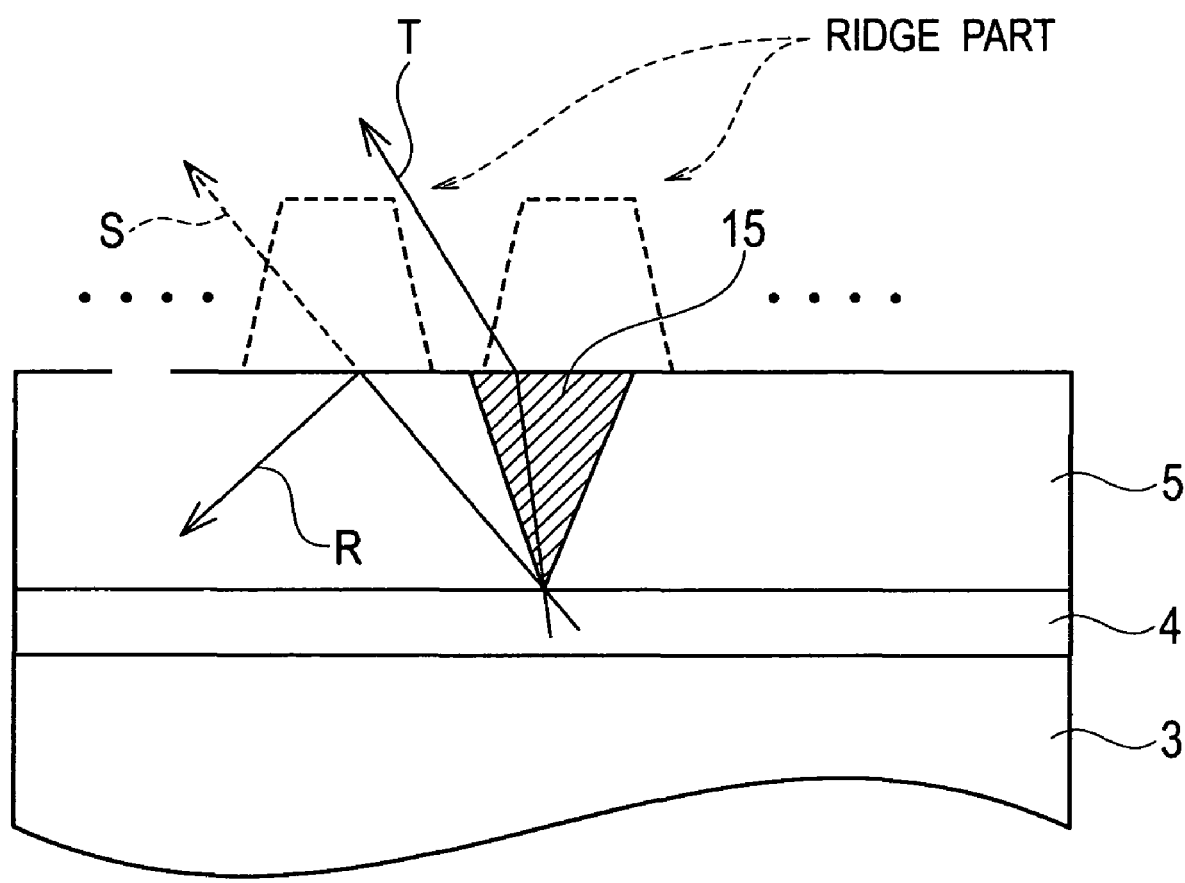
FIG. 11 is a schematic view describing how light extraction efficiency is improved by formation of a ridge part.
Figure 12:
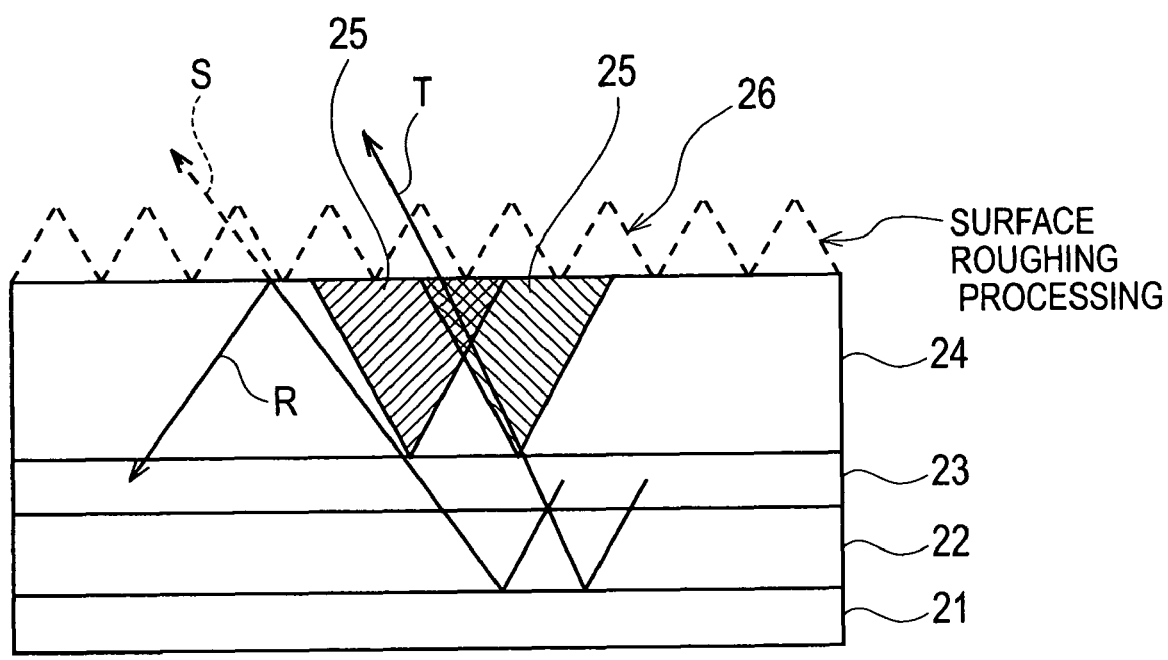
FIG. 12 is a schematic view illustrating a structure of a conventional nitride semiconductor light emitting device having improved light extraction efficiency.

Light extraction in the nitride semiconductor light emitting device having the ridge part formed as described above is illustrated in FIG. 11. FIG. 11 is a schematic view in which some ridge parts are representatively shown by a broken line so as to show light pathway from the MQW active layer 4. The semiconductor layers denoted by the reference numerals 3, 4, and 5 in the drawing represent the same configurations as those in FIG. 1.

A range of light incoming into a boundary surface at an angle smaller than a critical angle below which no total reflection occurs is indicated by a light extraction cone 15. Light which is emitted from the MQW active layer 4 and comes into the range of the light extraction cone 15 goes into the atmosphere as shown by an arrow of a solid line T and is extracted. Here, if it is supposedly the case where the ridge part indicated by the broken line is not present, light which does not come into the range of the light extraction cone 15 causes total reflection at an interface between the p-type GaN contact layer 5 and the atmospheric layer, as shown by the solid line R, and it is impossible to extract the light.

However, in the case where the ridge part is formed, since the p-type GaN contact layer 5 and the ridge part are both composed of a GaN-based semiconductor, a difference in index of refraction between the p-type GaN contact layer 5 and the ridge part is almost eliminated. Accordingly, light shown by the solid line R which has been totally reflected at the interface goes straight into the ridge part, and the incident angle into the side surface of the ridge part is smaller than a critical angle. Accordingly, the light is emitted into the atmosphere as shown by a broken line S; therefore, the light extracting efficiency is improved. Furthermore, the ridge part is formed not by a processing treatment, such as etching and blast, but by crystal growth, such as a selective growth method. Therefore, no detriment or damage is caused on the GaN-based semiconductor device constituting the light extraction surface.

Figure 13:
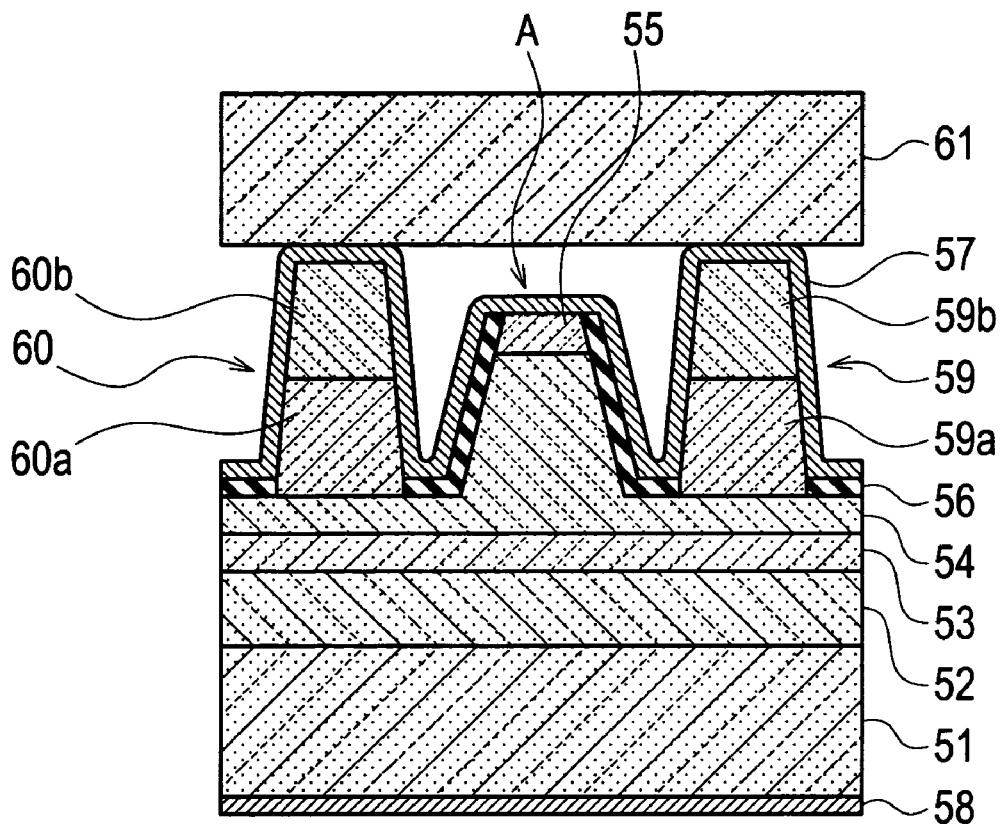
FIG. 13 is a view illustrating an example of a cross-sectional structure of a nitride semiconductor light emitting device of the present invention.

Next, as another example of a nitride semiconductor light emitting device, one embodiment in which the present invention is adopted in a ridge waveguide-type nitride semiconductor laser having a ridge stripe structure will be described. FIG. 13 illustrates a cross-sectional structure of a nitride semiconductor laser device as an example of a nitride semiconductor light emitting device of the present invention.

A nitride semiconductor constituting the nitride semiconductor layer device is formed by a well-known MOCVD method or the like. Here, the nitride semiconductor represents a quaternary mixed crystal of AlGaInN, and is a so-called III-V group nitride semiconductor, and can be expressed as $Al_xGa_yIn_zN$ ($X+Y+Z=1$, $0 \leq x \leq 1$, $0 \leq y \leq 1$, $0 \leq z \leq 1$). In the meantime, a GaN-based semiconductor is a semiconductor composed only of GaN or a semiconductor including GaN in the constituent materials, and can be expressed as $0 < y \leq 1$ in the above-described quaternary mixed crystal of AlGaInN.

Figure 22:
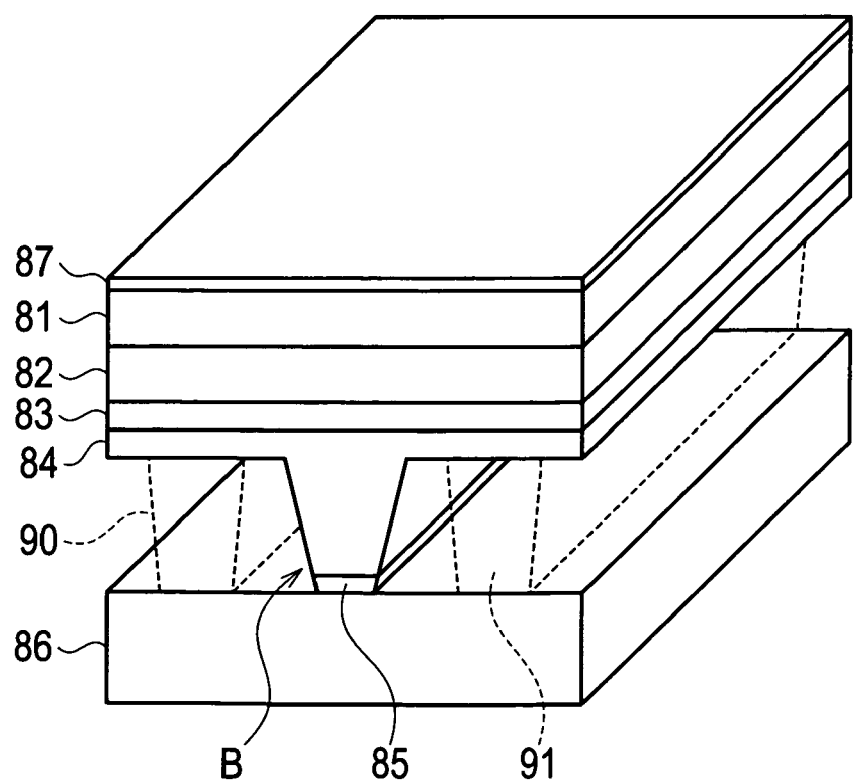
FIG. 22 is a perspective view illustrating a schematic structure of a standard ridge waveguide-type nitride semiconductor laser device.

On a GaN substrate 51, an n-type GaN contact layer 52, a MQW active layer 53, and a p-type AlGaN cladding layer 54 are sequentially stacked. A part of the p-type AlGaN cladding layer 54 is, as the ridge stripe part B in FIG. 22, formed in a convex-shaped ridge stripe structure. For the GaN substrate 51, conductive n-type GaN is adopted. On the rear surface of the GaN substrate 51, an n electrode 58 is formed. Furthermore, immediately above the ridge stripe structure of the p-type AlGaN cladding layer 54, a p-type GaN contact layer 55 is formed in a stripe pattern. The convex-shaped ridge stripe of the p-type AlGaN cladding layer 54 and the p-type GaN contact layer 55 constitute a ridge part A.

The MQW active layer 53 is an active layer having a quantum well structure, and has a structure in which a well layer is sandwiched by barrier layers each having a band gap larger than that of the well layer. An MQW structure, that is, a multiple quantum well structure, is obtained by multiplexing the quantum well structure. Here, the active layer 53 may not be formed as MQW, but as SQW (single quantum well) having a single quantum well structure.

Furthermore, on both sides of the ridge part A, supporting columns 59 and 60 composed of a GaN-based semiconductor are respectively formed. The supporting column 59 is composed of an n-type GaN layer 59*a* and a p-type GaN layer 59*b*, and the supporting column 60 is composed of an n-type GaN layer 60*a* and a p-type GaN layer 60*b*. These supporting columns 59 and 60 are constituted into a ridge stripe structure similar to that of the ridge part A, and, as illustrated in FIG. 18, a height H1 of the supporting column 59 and a height H2 of the supporting column 60 are formed to be higher than the height HA of the ridge part A (HA<H1, HA<H2). Furthermore, H1 and H2 are formed to be the same height (H1=H2).

The side surface of the ridge part A is covered by an insulating film 56, and the surface of the p-type AlGaN cladding layer 54, except for the region in which the supporting columns 59 and 60 are formed, is also covered by the insulating film 56. A p electrode 57 is formed all over from the side surface and the top of the supporting columns 59 and 60 to the side surface and the top of the ridge part A so as to cover the insulating film 56 or the GaN-based semiconductor surface.

A part of the p electrode 57 formed in a top region of the supporting columns 59 and 60 is joined to a supporting substrate 61, while a top region of the ridge part A is not joined to or in contact with the supporting substrate 61 and is formed so as to have a gap as shown in the drawing. The supporting substrate 61 is composed of conductive metal having a good heat releasing property, such as copper (Cu).

In the configuration illustrated in FIG. 13, the n-type GaN contact layer 52 corresponds to an n-type nitride semiconductor layer, and the p-type AlGaN cladding layer 54 and the p-type GaN contact layer 55 correspond to a p-type GaN-based semiconductor layer. Furthermore, in the configuration in FIG. 13, an n-type AlGaN cladding layer may be sandwiched between the n-type GaN contact layer 52 and the MQW active layer 53. In such a case, the n-type GaN contact layer 52 and the n-type AlGaN cladding layer correspond to an n-type nitride semiconductor layer.

In FIG. 13, it is configured that GaN-based semiconductors constituting the supporting columns 59 and 60 are p-type GaN layers 59*b* and 60*b* and n-type GaN layer 59*a* and 60*a* from the upper side, and an np junction interface between the n-type GaN layer 59*a* and the p-type AlGaN cladding layer 54 and an np junction interface between the n-type GaN layer 60*a* and the p-type AlGaN cladding layer 54 are formed so that at least one np junction interface is included in the supporting columns 59 and 60. As a GaN-based semiconductor constituting the supporting columns 59 and 60, in addition to GaN illustrated in FIG. 13, AlGaN, InGaN, and the like may also be used.

In order to configure that at least np junction interface is included in the supporting columns 59 and 60, other than the above-described example, for example, the supporting columns 59 and 60 may be formed only by n-type GaN-based semiconductor, such as an n-type GaN layer and an n-type AlGaN layer, or a stacked body in which a p-type GaN-based semiconductor and an n-type GaN-based semiconductor are alternately stacked as a pair in plural cycles from the p electrode side may be used.

The reason why at least one np junction interface is formed when viewed from the p electrode side as described above is as follows. The p electrode 57 is formed in the columns 59 and 60. Accordingly, in the case where voltage is applied, when an electric current flows through the supporting columns 59 and 60, a large effect on light emission intensity and light emitting properties is caused. Therefore, by having an np junction, which is a reverse bias structure, it is configured that no electric current flows into the device through the supporting columns 59 and 60; therefore, an insulating effect is achieved.

On the other hand, regarding the shape of the supporting columns 59 and 60, in the above-described embodiment, a ridge stripe structure similar to that of the ridge part A is adopted. However, by not having one long stripe structure but separating into several pieces, multiple supporting columns, for example, such as 4 pieces and 6 pieces, may be configured to support the supporting substrate 61. Furthermore, a supporting column is necessary at least on both sides of the ridge part A. Accordingly, multiple supporting columns may be provided by providing a supporting column further outside of the supporting columns 59 and 60.

In the meantime, as illustrated in FIG. 18, the heights H1 and H2 of the respective supporting columns 59 and 60 are desirably formed to be the same; however, the heights H1 and H2 may not be equal. In such a case, a difference between H1 and H2 is required to be set within a range so that the supporting substrate 61 does not come into contact with the top surface of the ridge part A when the supporting substrate 61 is bonded.

As described above, the supporting columns 59 and 60 are formed by a GaN-based semiconductor and the p-type semiconductor layer having the ridge part A is also formed by a GaN-based semiconductor. Accordingly, GaN is contained as a common constituting material. Therefore, a difference in heat expansion coefficient between the supporting column and the p-type semiconductor layer having the ridge part is eliminated, occurrence of stress caused by the difference is prevented, and no adverse effect on the ridge part is caused.

Furthermore, the supporting columns formed by GaN-based semiconductors are arranged on at least both sides of the ridge part so as to surround the ridge part. Accordingly, in a process of scribing and dividing a wafer, the supporting columns serve as protection walls, and the ridge part does not directly come into contact with a stage or the like. In the meantime, the height of each supporting column is set to be larger than the height of the ridge part. Accordingly, in the bonding to the supporting substrate, the supporting columns serve as protection walls; therefore, it is possible to prevent pressure or stress from being applied to the ridge part.

Next, a manufacturing method of the nitride semiconductor light emitting device in FIG. 13 will be described hereinafter with reference to FIG. 14 to FIG. 21. Firstly, a GaN substrate 51 serving as a growth substrate is placed in a metal organic chemical vapor deposition (MOCVD) device, and the temperature is raised to approximately 1050° C. while circulating hydrogen gas so as to subject the GaN substrate 51 to thermal cleaning. While the temperature is maintained, a reactive gas used as a N material, which is, for example, NH$_3$, and a Ga material gas, which is, for example, trimethyl gallium (TMGa) are supplied, and silane (SiH$_4$) as an n-type dopant gas is supplied so as to grow the n-type GaN contact layer 52.

Next, the supply of TMGa and silane is stopped, and the temperature of the substrate is lowered to a temperature in a range from 700° C. to 800° C. in a mixed atmosphere of ammonia and hydrogen. Then, trimethyl indium (TMIn) and triethyl gallium (TEGa) are supplied so as to stack an InGaN well layer of the MQW active layer 53, and then only the supply of TMIn is stopped so as to stack a barrier layer composed of undoped GaN. Then, a multi-quantum well structure is obtained by the repetition of the GaN barrier layer and the InGaN well layer.

After the growth of the MQW active layer 53, the growth temperature is raised to 1020° C. to 1040° C., and trimethyl gallium (TMGa), which is a raw material gas providing Ga atoms, ammonia (NH$_3$), which is a raw material gas providing nitrogen atoms, trimethyl aluminum (TMA), which is a raw material gas providing Al atoms, and bis-cyclopentadienyl magnesium (CP$_2$Mg), which is a dopant material providing p-type impurity Mg, are supplied so as to grow the p-type AlGaN cladding layer 54. Next, by maintaining the growth temperature and stopping the supply of TMA so as to grow the p-type GaN contact layer 55, a stacked body, as illustrated in FIG. 14, in which the GaN substrate 51 up to the p-type GaN contact layer 55 are stacked.

Figure 14:
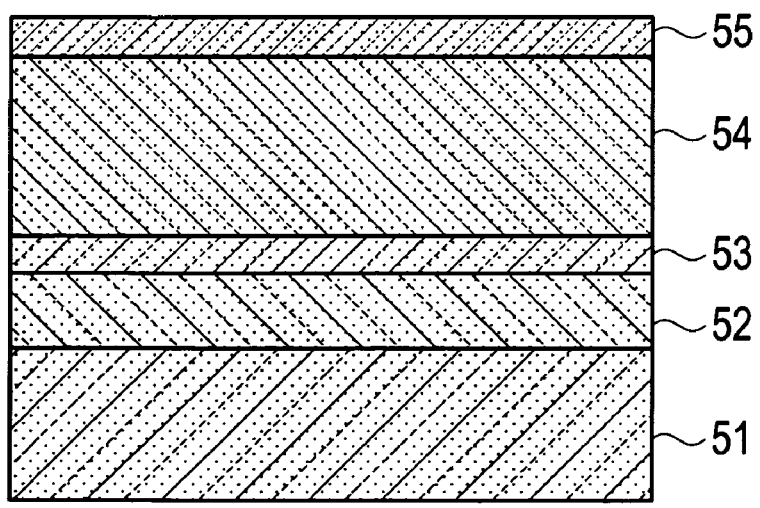
FIG. 14 is a view illustrating a manufacturing process of the nitride semiconductor light emitting device in FIG. 13.

Here, as an example of film thicknesses in the stacked body in FIG. 14, it can be configured that the n-type GaN contact layer 52 has a film thickness of approximately 4 µm, the MQW active layer 53 has a film thickness of approximately 0.1 µm, the p-type AlGaN cladding layer 54 has a film thickness of approximately 2 µm, and the p-type GaN contact layer 55 has a film thickness of approximately 0.1 µm.

Figure 15:
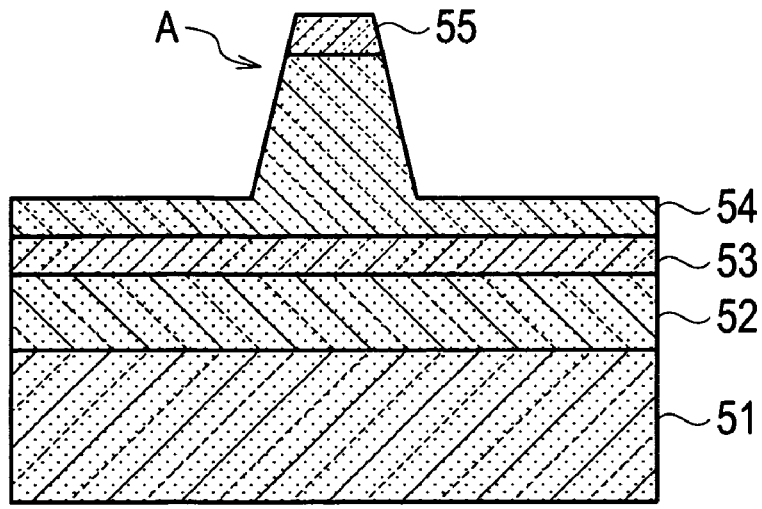
FIG. 15 is a view illustrating the manufacturing process of the nitride semiconductor light emitting device in FIG. 13.

Next, as illustrated in FIG. 15, the ridge part A is formed by mesa etching. The formation of the ridge part A is carried out by forming a mask on the p-type GaN contact layer 55 in a region corresponding to the top of the ridge part A, and then etching the p-type AlGaN cladding layer 54 up to a predetermined depth by dry etching. For the dry etching, reactive ion etching (RIE), ICP by plasma, or the like is adopted. The ridge part A is formed, for example, to have a height of 1.5 µm and a width of a bottom part of the ridge stripe of 1.5 µm. The width of the bottom part of the ridge stripe is desirably formed to be thin for the purpose of improving a kink level.

Figure 16:
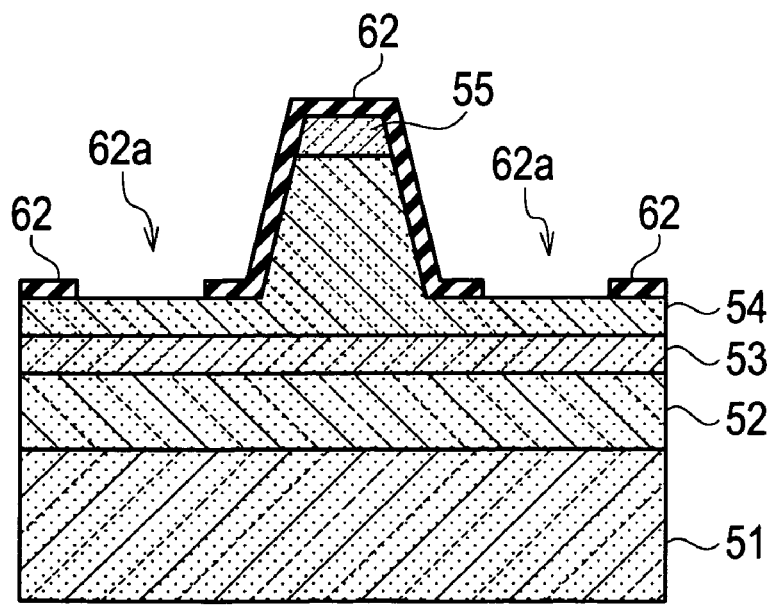
FIG. 16 is a view illustrating the manufacturing process of the nitride semiconductor light emitting device in FIG. 13.

Thereafter, a selective growth mask 62 is formed all over the surface of the nitride semiconductor on the side where the ridge part A is formed. As illustrated in FIG. 16, after a resist to serve as the selective growth mask 62 is applied for coating by Spin On Glass (SOG), an opening part 62*a* is formed by removing a part in which the supporting columns 59 and 60 are to be manufactured, and the nitride semiconductor surface is exposed.

Figure 17:
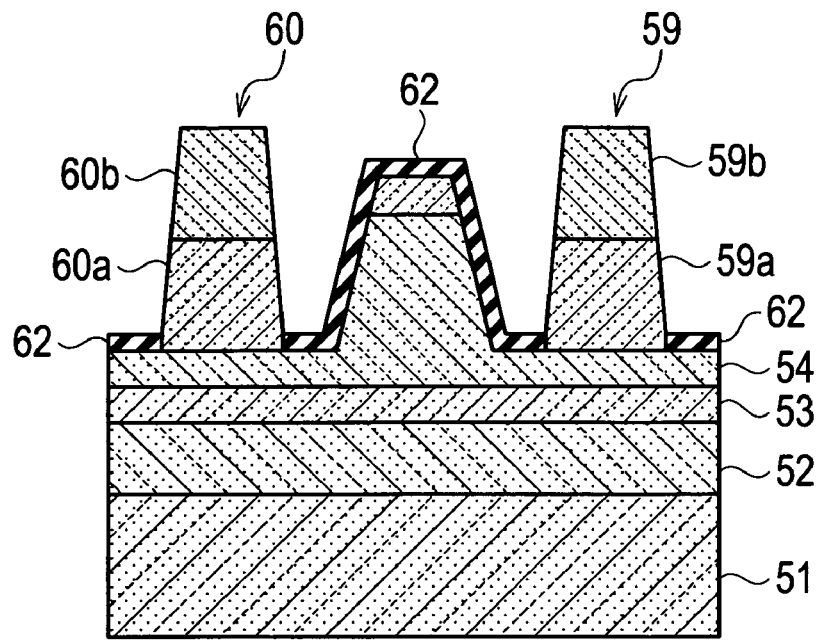
FIG. 17 is a view illustrating the manufacturing process of the nitride semiconductor light emitting device in FIG. 13.

Next, as illustrated in FIG. 17, a nitride semiconductor is grown in the opening part of the selective growth mask 62, and the supporting columns 59 and 60 are manufactured. By the way, lattice constants are different between a growth substrate, such as a sapphire substrate, and GaN. Accordingly, in a GaN-based semiconductor layer grown on a growth substrate, there is dislocation (lattice defect) in a direction vertically extending from the substrate. As a method to reduce such dislocation, selective epitaxial lateral overgrowth (ELO) is well-known. In the present invention, the above-described selective growth is used.

In this selective growth, by covering the p-type AlGaN cladding layer 54 with the selective growth mask 62 composed of a dielectric body, SOG, or the like, re-growth firstly occurs from the center of the opening part 62*a* of the selective growth mask 62 (selective growth), and then a growth layer also extends to the side of the selective growth mask 62 so that crystal growth is formed in a lateral direction.

The selective growth is carried out at a growth temperature of 900° C. or below. When a p-type GaN layer is crystal grown after the crystal growth of an n-type GaN layer, as shown in the supporting columns 59 and 60, the n-type GaN layers 59*a* and 60*a* and the p-type GaN layers 59*b* and 60*b* are formed. Here, in the case where selective growth is carried out, a condition is set so as to make the growth rate in a longitudinal direction is larger than the growth rate in a lateral direction.

Furthermore, in the case where a p-type GaN-based layer is formed after the growth of the MQW active layer 53 by InGaN/GaN, in order to enhance crystal quality, epitaxial growth is normally carried out at a growth temperature approximately 1000° C., which is 200 to 300° C. higher than the growth temperature of the active layer. When the growth temperature of the p-type layer is high as described above, the InGaN well layer of the active layer 53 which has already been formed is susceptible to heat damage. Accordingly, the light emitting properties may be significantly deteriorated. Therefore, after the formation of the active layer 53, it is necessary to shorten a total time period for crystal growth at a high temperature around 1000° C. as much as possible. On the other hand, since the supporting columns 59 and 60 are not a part which contributes to light emission, it is not necessary to place too much importance on the crystal quality. Therefore, by adopting a growth temperature of 900° C. or below, heat damage on the active layer 53 is avoided as much as possible.

By the way, normally, when $H_2$ is used as a carrier gas, it is difficult to activate Mg due to hydrogen atoms which are brought into together with Mg, and this becomes a cause for interference with making a p-type semiconductor layer p-type. Therefore, it is necessary to perform annealing (hereinafter, referred to as "p-type annealing") to make a p-type semiconductor layer p-type by removing the hydrogen atoms after the formation of the p-type AlGaN cladding layer 54 and the p-type GaN contact layer 55.

However, in the present embodiment, in the case where the supporting columns 59 and 60 are epitaxially grown, an amount of the carrier gas $H_2$ and $NH_3$, which is a raw material gas providing nitrogen, is reduced. Accordingly, by utilizing heat at the growth temperature in the growth of the supporting columns 59 and 60, it is possible to remove $H_2$ contained in the p-type GaN and the p-type AlGaN which constitute the ridge part A which has already been manufactured and to activate the p-type impurity Mg. Therefore, it is possible to eliminate the need for the p-type annealing.

Furthermore, since the supporting columns 59 and 60 are crystal grown at a growth temperature of 900° C. or below, no damage is caused on the MQW active layer 53. In the meantime, in the selective growth, a raw material gas necessary to manufacture at least GaN is supplied, decomposition of the GaN component from films, which are the p-type AlGaN cladding layer 54 and the p-type GaN contact layer 55, constituting the ridge part A which has already been formed can be prevented.

Meanwhile, in the case where the supporting columns 59 and 60 are formed not by selective growth by dry etching, the formation is carried out in the same process as the manufacturing of the ridge part A. Accordingly, a problem occurs in which control in a depth direction is difficult, film thicknesses C1 and C2 of the p-type AlGaN cladding layers 54 respectively located on both sides of the ridge part A are not uniform, and characteristics, such as a threshold value of the laser device, are deteriorated.

However, in the present embodiment, since the supporting columns 59 and 60 are crystal grown by selective growth, accuracy of the thicknesses C1 and C2 of the p-type AlGaN in the region on both sides of the ridge part A is high; therefore, it is possible to prevent deterioration in laser device characteristics due to scale variations.

Next, as illustrated in FIG. 18, the selective growth mask 62 is removed. As described above, the height H1 of the supporting column 59 and the height H2 of the supporting column 60 from the flat surface of the p-type AlGaN cladding layer 54 are set to be larger than the height HA of the ridge part A from the flat surface of the p-type AlGaN cladding layer 54 (HA<H1, HA<H2). Furthermore, as described above, it is desirable that H1 and H2 be formed to be equal; however, the heights H1 and H2 may not be equal.

Figure 19:
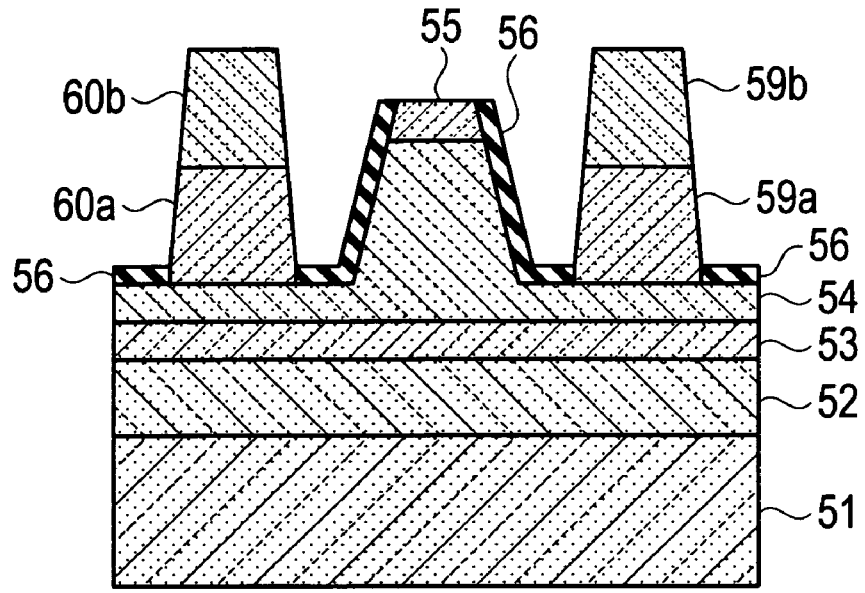
FIG. 19 is a view illustrating the manufacturing process of the nitride semiconductor light emitting device in FIG. 13.
Figure 20:
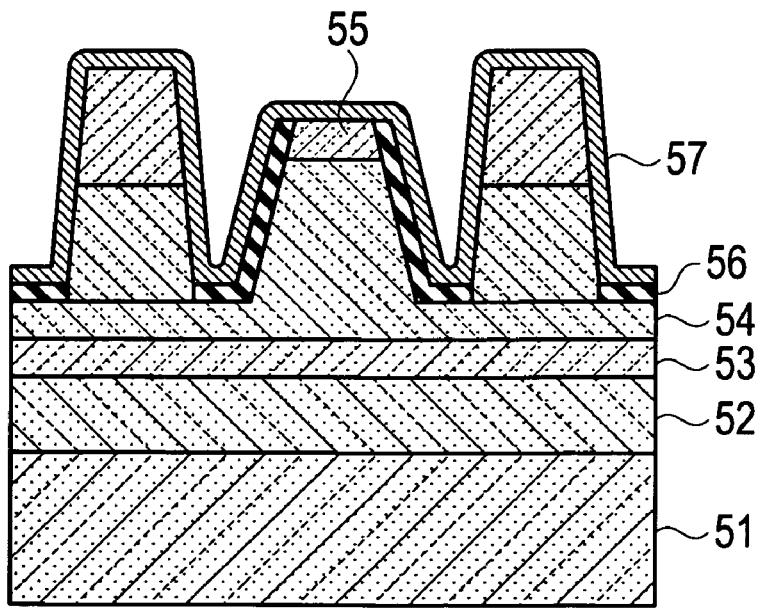
FIG. 20 is a view illustrating the manufacturing process of the nitride semiconductor light emitting device in FIG. 13.

As illustrated in FIG. 19, as the insulating film 56, $ZrO_2$ or the like, for example, is formed on the flat surface of the p-type AlGaN cladding layer 54 and the side surface of the ridge part A. Next, as illustrated in FIG. 20, the p electrode 57 is formed on the insulating film 56 over the entire surface from the nitride semiconductor surface of the supporting columns 59 and 60 and the nitride semiconductor surface of the ridge part A by deposition or sputtering. The p electrode 57 is formed by forming, for example, palladium (Pd) at a thickness of 100 Å and gold (Au) at a thickness of 1250 Å from the bottom, and further forming thereon Au as a bonding metal layer at approximately 5 µm.

Figure 21:
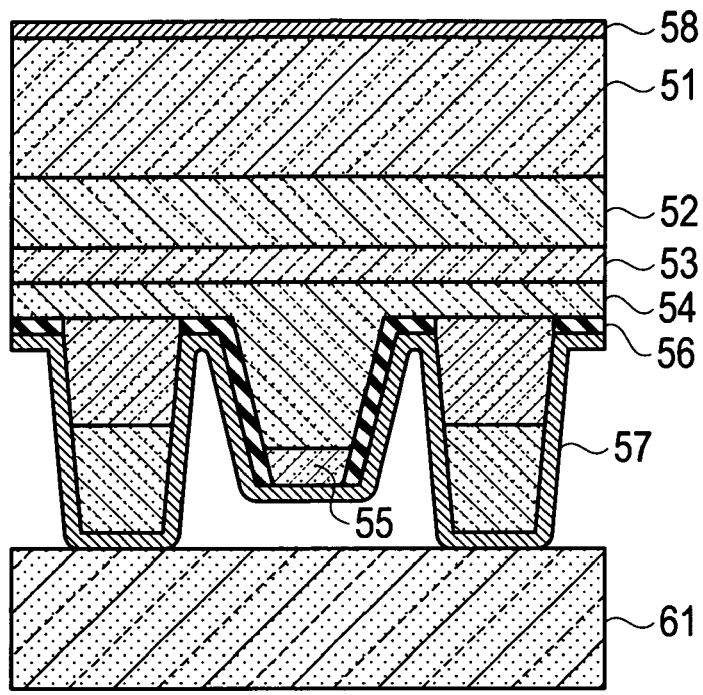
FIG. 21 is a view illustrating the manufacturing process of the nitride semiconductor light emitting device in FIG. 13.

Next, when the whole wafer illustrated in FIG. 20 is flip-chip bonded to the supporting substrate 61 composed of Cu or the like, a configuration illustrated in FIG. 21 is obtained. Here, for the flip-chip bonding, solder bonding, ultrasound bonding, or the like is adopted. Lastly, an n electrode 58 is formed by sequentially forming, for example, palladium (Pd) at a thickness of 100 Å and gold (Au) at a thickness of 1250 Å from the GaN substrate 51 side, and then the nitride semiconductor light emitting device in FIG. 13 is completed.

Note that, as for the manufacture of the individual semiconductor layers, it is possible to form a semiconductor layer having a predetermined composition and a predetermined conductivity type at a necessary thickness by sequentially growing at a temperature in an approximate range from 700° C. to 1200° C. while supplying, together with hydrogen or nitrogen which serves as a carrier gas, a reactant gas, such as triethyl gallium (TEGa), trimethyl gallium (TMGa), ammonia ($NH_3$), trimethyl aluminum (TMA), and trimethyl indium (TMIn), which corresponds to a component of the individual semiconductor layers, and a necessary gas, such as silane ($SiH_4$) as a dopant gas for forming an n-type layer and $CP_2Mg$ (cyclopentadienyl magnesium) as a dopant gas for forming a p-type layer.

As described above, it is obvious that the present invention includes various embodiments and the like which are not described herein. Therefore, the technical scope of the present invention is determined only by the following claims that can be regarded appropriate from the above-mentioned descriptions.

What is claimed is:

1. A nitride semiconductor light emitting device comprising at least:
    an n-type GaN-based semiconductor layer;
    an active layer; and
    a p-type GaN-based semiconductor layer, wherein, on one surface of any one of the n-type GaN-based semiconductor layer and the p-type GaN-based semiconductor layer, asperities as a plurality of ridge parts are formed by crystal growth of GaN-based semiconductor, wherein
    the ridge parts are formed on a light extraction surface of the p-type GaN-based semiconductor layer and have an InGaN/GaN quantum well structure, and
    an In composition ratio of the InGaN is higher than an In composition ratio of a well layer of the active layer.

2. The nitride semiconductor light emitting device of claim 1, wherein the crystal growth of the ridge parts is performed by selective growth.

3. The nitride semiconductor light emitting device of claim 2, wherein
    a shape of each ridge part is any one of six-sided pyramid and three-sided pyramid, and
    one side of each ridge part is formed in parallel with an M-plane.

4. The nitride semiconductor light emitting device of claim 1, wherein the ridge parts are formed on a light extraction surface of the p-type GaN-based semiconductor layer and are formed of a p-type GaN layer.

5. The nitride semiconductor light emitting device of claim 1, wherein the ridge part are formed on a light extraction surface of the p-type GaN-based semiconductor layer and are formed of an n-type GaN layer having a carrier concentration of at least $10^{19}$ cm$^{-3}$.

6. The nitride semiconductor light emitting device of claim 1, wherein the InGaN/GaN quantum well structure is doped with an n-type impurity.

7. The nitride semiconductor light emitting device of claim 2, wherein the ridge parts are formed on a light extraction surface of the p-type GaN-based semiconductor layer and are formed of a p-type GaN layer.

8. The nitride semiconductor light emitting device of claim 3, wherein the ridge parts are formed on a light extraction surface of the p-type GaN-based semiconductor layer and are formed of a p-type GaN layer.

9. The nitride semiconductor light emitting device of claim 2, wherein the ridge part are formed on a light extraction surface of the p-type GaN-based semiconductor layer and are formed of an n-type GaN layer having a carrier concentration of at least $10^{19}$ cm$^{-3}$.

10. The nitride semiconductor light emitting device of claim 3, wherein the ridge part are formed on a light extraction surface of the p-type GaN-based semiconductor layer and are formed of an n-type GaN layer having a carrier concentration of at least $10^{19}$ cm$^{-3}$.

11. The nitride semiconductor light emitting device of claim 1, wherein the InGaN/GaN quantum well structure is doped with an n-type impurity.

* * * * *